(12) United States Patent
Rojo et al.

(10) Patent No.: US 6,407,850 B1
(45) Date of Patent: Jun. 18, 2002

(54) AUTO TILT STAGE

(75) Inventors: Hector M. Rojo; Ron L. Cervantes, both of Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 8 days.

(21) Appl. No.: 09/677,124

(22) Filed: Sep. 29, 2000

(51) Int. Cl.⁷ .............................................. G02B 26/00
(52) U.S. Cl. ...................................................... 359/290
(58) Field of Search ................................. 359/290, 291, 359/292, 293, 296, 373, 370; 438/114

(56) References Cited

U.S. PATENT DOCUMENTS 6,335,224 B1 * 1/2002 Peterson et al. ............ 438/114
6,337,027 B1 * 1/2002 Humphrey ..................... 216/2

* cited by examiner

Primary Examiner—Ricky Mack
Assistant Examiner—Omar Hindi
(74) Attorney, Agent, or Firm—Blakely, Sokoloff, Taylor & Zafman LLP

(57) ABSTRACT

The present invention describes a device with a first part, said first part adapted to move from a first position to a second position; a second part, said second part coupled to said first part; and a third part, said third part adapted to move between said first part and said second part to cause said second part to pivot at a constant distance from said first part.

21 Claims, 5 Drawing Sheets

AUTO TILT STAGE

BACKGROUND OF THE INVENTION

1. Field of the Invention

The present invention relates to the field of semiconductor integrated circuit (IC) manufacturing, and more specifically, to an apparatus for automatically tilting a sample to a desired angle for processing, measurement, or inspection.

2. Discussion of Related Art

During semiconductor IC manufacturing, failure analysis (FA) of a product is often performed at various stages of processing to locate failures and identify causes. The FA may include physical or chemical techniques. A common type of physical FA is to cross-section a Silicon wafer containing the product for analysis in a transmission electron microscope (TEM). A TEM can resolve structural details in the devices that are on the order of 2 Angstroms.

TEM samples may be prepared with various orientations to reveal different parts of the device structure. Examples are shown in FIG. 1(a) and FIG. 1(b). A TEM sample 130 has a length 110 of about 3 millimeters, a height 112 of about 1 millimeter, and a depth 114 of about 20 micrometers. The TEM sample 130 has a device layer 103 formed on a substrate 105. A platinum cap 107 is deposited over a region of interest 116. Ion milling is used to remove material from one side 133 of the Platinum cap 107. Then ion milling is used to remove material from the other side 136 of the Platinum cap 107. As a result, an area of interest 116 in the sample 130 is reduced to a thickness 118 of about 1000 Angstroms so electrons can penetrate to form an image. The platinum cap 107 is subsequently removed.

In a dual-beam focused ion beam (FIB) tool from FEI corporation, as shown in FIG. 2(a), an ion beam 220 is used to sputter away material from the sample 230 while, at the same time, an electron beam 225 is used to monitor the progress. The electron beam 225 points downwards vertically while the ion beam 220 points downwards with an angle 265 from the vertical. In the XL820 model of the tool, the angle 265 is fixed at 52 degrees.

FIG. 2(a) shows a sample 230 that is clamped in a vice 240 attached to a stage 260. The sample 230 should be parallel to the ion beam 220 in order to be thinned down properly from the top down. In order to align the sample 230 with the ion beam 220, a stage 260 on which the sample 230 rests must be tilted at an angle 275. If the sample 230 is mounted perpendicularly relative to the stage 260, as is desired, then the tilt angle 275 will be equal to a sample rotation angle 270.

The sample 230 may be inadvertently misaligned in a vice 240 by an angle 280 from the vertical, as shown in FIG. 2(b). In such a case, the sample 230 would not be mounted perpendicularly relative to the stage 260.

One problematic consequence of sample misalignment is that the ion beam 220 may not be able to mill one side 233 of the sample 230 straight down since the tilt angle 275 of the XL820 stage 260 cannot go beyond 52 degrees. Another problem is that the electron beam 225 may not be able to monitor the progress of the ion milling if the side 233 being ion milled is not directly in the line of sight of the electron beam 225. Milling "blindly" may result in poor control of depth and symmetry.

A similar problem may arise with misalignment of a sample 230 that is being converted from analysis with a scanning electron microscope (SEM) to analysis with a TEM. In a TEM sample, a deposited platinum cap 107 protects the top surface directly over a region of interest 116, as shown in FIG. 1(a) and FIG. 1(b). However, a sample previously analyzed with a SEM will have platinum covering the face (not shown), as well as the top surface, of the region of interest 116. As a result, the additional platinum protecting the face of the region of interest 116 cannot be milled of symmetrically since the stage 260 of the XL820 is unable to tilt to an angle 275 that exceeds 52 degrees.

A possible solution for handling a misaligned sample 230 is to modify the stage 260 to tilt at an angle 275 that is beyond the mill angle 265 of 52 degrees. However, such a modification would be costly and difficult to implement.

Thus, what is needed is an apparatus for automatically tilting a sample to a desired angle for processing, measurement, or inspection.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a device, apparatus, or fixture for automatically pivoting, rotating, or tilting a part or member around an axis or a pin to a desired angle. One application is for preparation of a sample for transmission electron microscope (TEM) analysis. Another application is for measurement or inspection of an object. Other applications involve the processing of integrated circuits (ICs) where it may be desirable to change orientation, alignment, or position of a wafer prior to or during dry etching, sputtering, ion implantation, chemical-mechanical polishing, or deposition. The present invention is also applicable to the operation of an electromechanical device, including a micro-electro-mechanical system (MEMS), such as a micromirror.

Figure 1A:
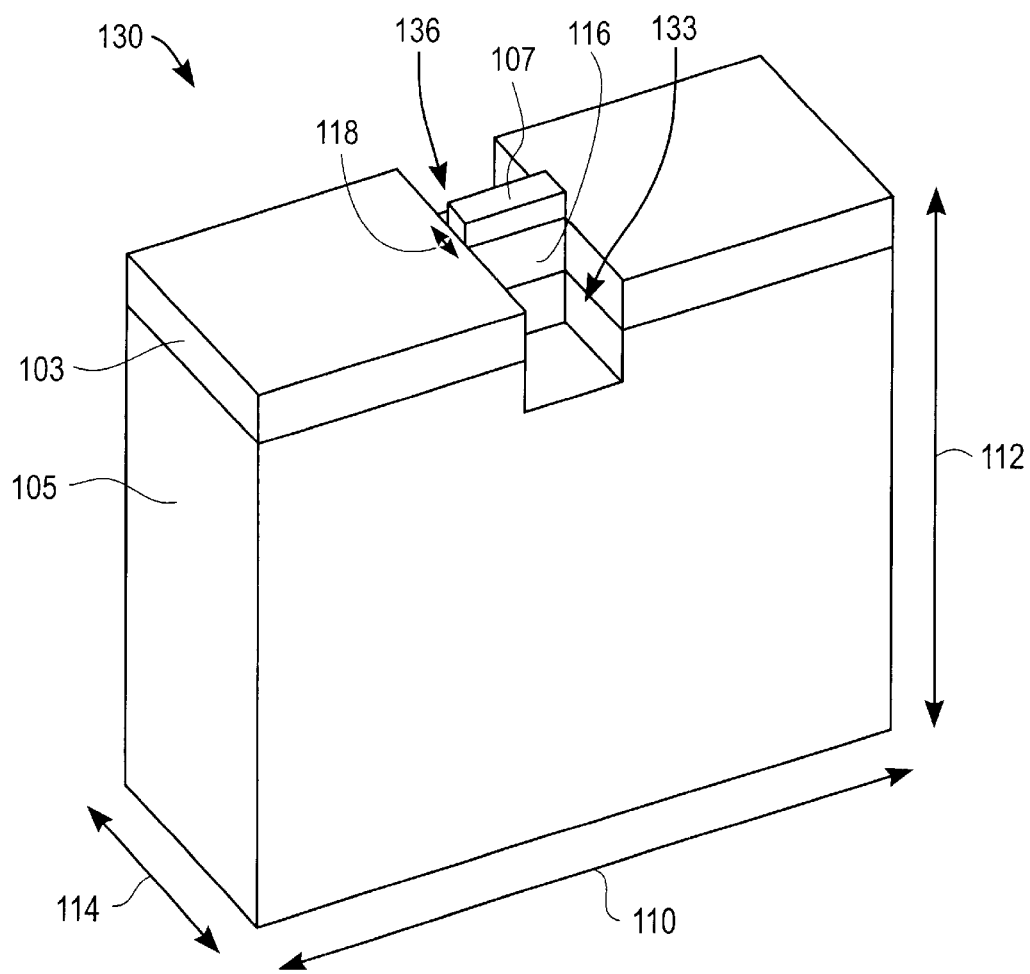
FIG. 1(a) is an illustration of a transmission electron microscope (TEM) sample with device layer facing up in the prior art.
Figure 1B:
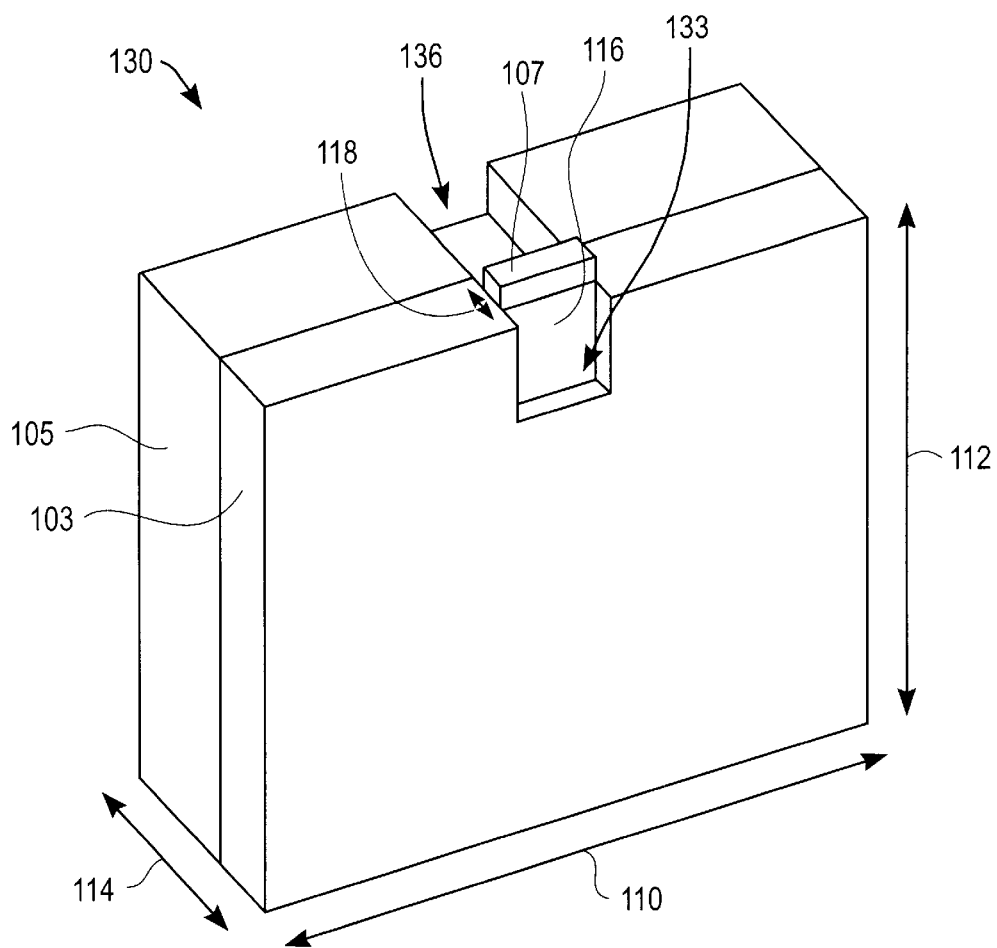
FIG. 1(b) is an illustration of a TEM sample with device layer facing sideways in the prior art.
Figure 2A:
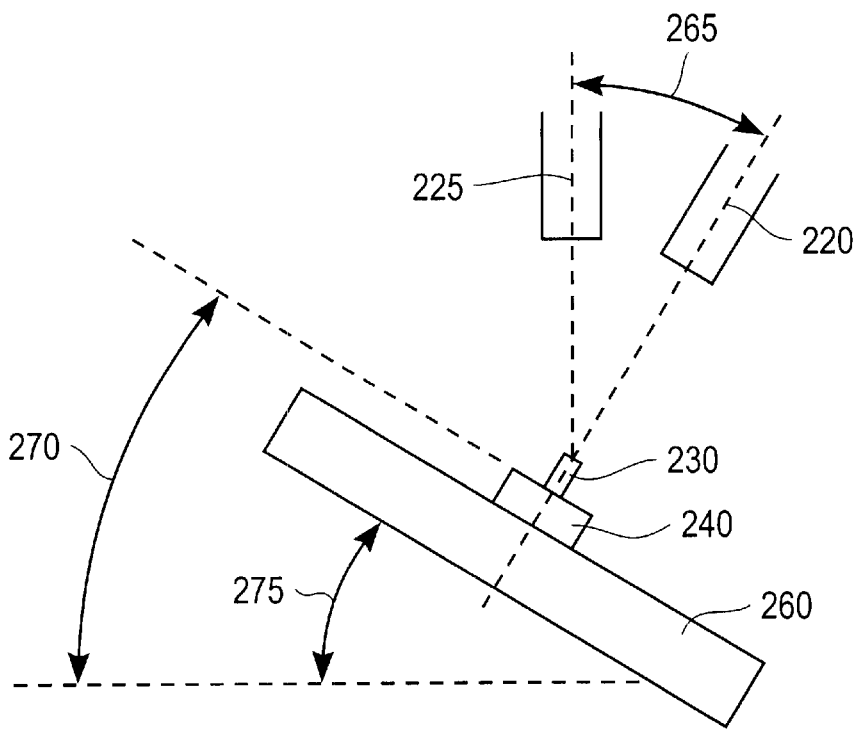
FIG. 2(a) is an illustration of a stage within a focused ion beam tool after tilting in the prior art.
Figure 2B:
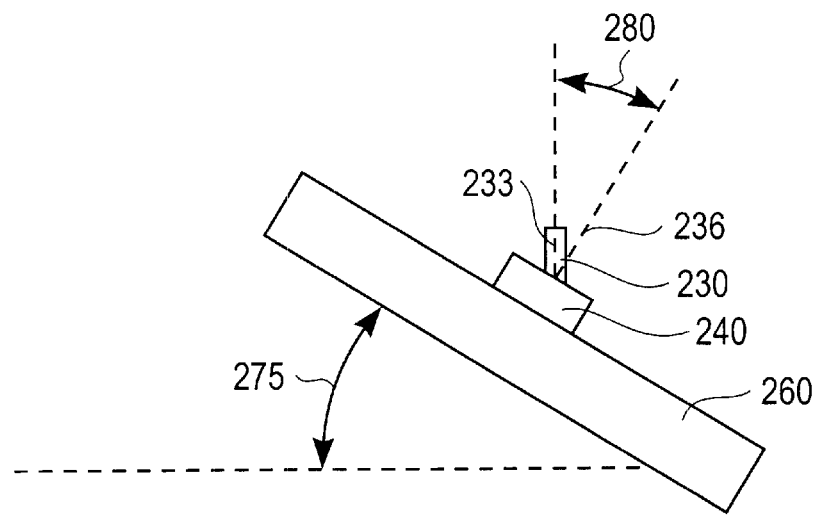
FIG. 2(b) is an illustration of a sample that is not mounted perpendicularly relative to a stage in the prior art.
Figure 3A:
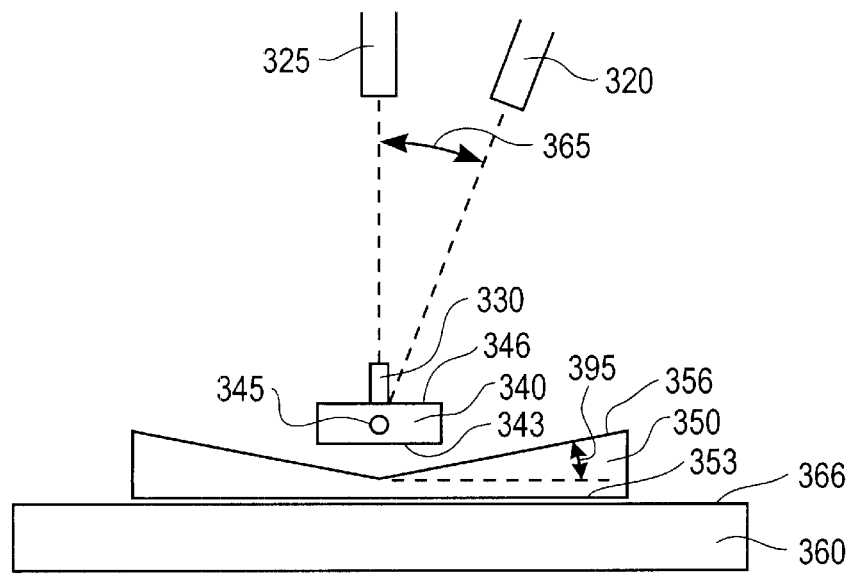
FIG. 3(a) is an illustration of an auto tilt stage before tilting according to the present invention.

According to one embodiment of the present invention, as shown in FIG. 3(a), a sample 330 is clamped in a vice 340 that can rotate around an axis 345. The sample 330 may be a portion of a Silicon wafer used for fabricating ICs that is attached to a copper grid. The vice 340 has a lower surface 343 and an upper surface 346. The axis 345 may be a pin that is attached to and suspended over a base plate 360.

A slider 350 fits between the base plate 360 and the vice 340. The vice 340 and the slider 350 may be made from stainless steel while the base plate 360 may be made from nickel-plated aluminum. The slider 350 may have a double-wedge shape, resembling two right-angled wedges that have been merged together towards their thinner ends. A lower surface 353 of the slider 350 may be flat. Towards each of the opposite ends of the slider 350, an upper surface 356 of the slider 350 is sloped upwards at an angle 395 relative to the lower surface 353.

Figure 3B:
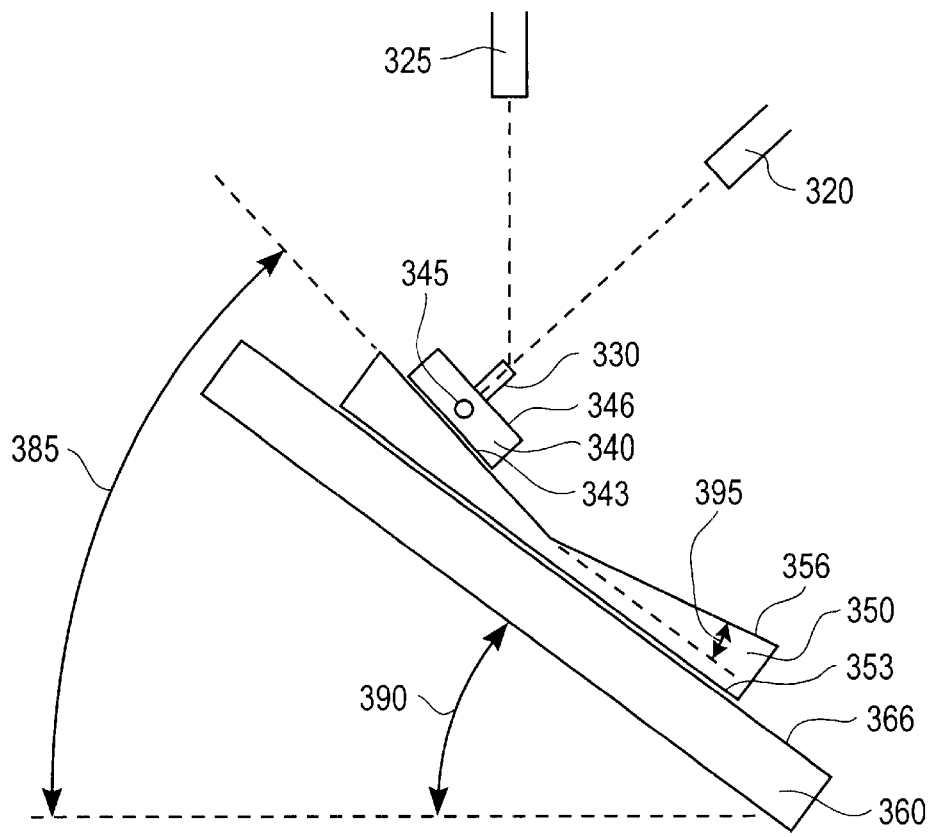
FIG. 3(b) is an illustration of an auto tilt stage after tilting according to the present invention.

When the base plate 360 is in a horizontal orientation, the upper surface 356 of the slider 350 is not in contact with the lower surface 343 of the vice 340. However, when the base plate 360 is tilted, as shown in FIG. 3(b), by an angle 390 that is large enough, friction between the lower surface 353 of the slider and the upper surface 366 of the base plate 360 will eventually be overcome so that the slider 350 slides on the upper surface 366 of the base plate 360 until the upper surface 356 of the slider 350 contacts the lower surface 343 of the vice 340, causing the vice 340 to rotate around an axis 345. Eventually, the lower surface 343 of the vice 340 becomes parallel to the upper surface 356 of the slider 350.

The angle 390 at which the slider 350 begins sliding may be adjusted by changing the mass of the slider 350, the material of construction of the slider 350, the material of construction of the base plate 360, the smoothness and frictional coefficient of the surface 353, the smoothness and frictional coefficient of the surface 366, and the size of the contact area of the surface 353 and the surface 366. The ease of rotation of the vice 340 around the axis 345 may also be adjustable.

The base plate 360 may be tilted by using an electrically-controlled motor or actuator. A pneumatically-controlled motor or actuator may also be used. In some applications, the slider may move due to other forces, such as centrifugal force.

In the XL820 model of a dual-beam focused ion beam (FIB) tool from FEI Corporation, the angle 390 is limited to a maximum value of 52 degrees by the configuration of the hardware within the vacuum chamber. Since a sample 330 may be misaligned from the vertical by about 2–5 degrees, the angle 395 should preferably be between 5 degrees and 15 degrees although other values may be used.

In one embodiment of the present invention, the angle 395 is fixed at 10 degrees. In such a case, when the base plate 360 is tilted until the angle 390 has reached its maximum value of 52 degrees, the sample 330 has in effect been tilted by an angle equivalent to the sum of the angle 390 and the angle 395, or a value of 62 degrees. At that point, the base plate 360 may be slightly tilted back towards the horizontal orientation in order to compensate for any misalignment in the sample 330 relative to the upper surface 346 of the vice 340. As a result, the sample 330 can then be correctly lined up with an ion beam 320 for ion milling while the progress of the milling is monitored at the same time with an electron beam 325.

The slider 350 may have different size and shape in other embodiments. In one embodiment, the slider 350 may be a shim with variable thickness. In another embodiment, the slider 350 may be a cam. Typically, the slider 350 has a lower surface 353 that is flat and an upper surface 356 that is thinner towards the center and thicker towards both ends. The thicker ends point towards the two opposite directions that the slider 350 is free to slide.

The slider 350 need not have a symmetrical shape. For example, the slider may have a single-wedge shape (not shown) rather than a double-wedge shape. In such a case, the entire base plate 360 may be turned 180 degrees if a tilt in the opposite direction is desired.

Furthermore, the upper surface 356 of the slider 350 and the lower surface 343 of the vice 340 need not be flat with a linear slope as long as the two surfaces accommodate each other. For example, the slope may be curved in a direction that the vice 340 can rotate.

Similarly, the upper surface 366 of the base plate 360 and the lower surface 353 of the slider 350 need not be flat with a linear slope as long as the two surfaces accommodate each other. For example, the upper surface 366 of the base plate 360 may be curved (not shown) in a direction parallel to a direction that the slider 350 can move. To facilitate movement of the slider 350 when the base plate 360 is tilted, roller bearings (not shown) may be used.

The curvature of a surface may be elliptical, parabolic, hyperbolic, or empirically determined for best fit. The present invention contemplates both positive slope and negative slope in the curvature. Positive slope would result in an additive effect where the sample rotation angle 385 is larger than the nominal stage tilt angle 390. Negative slope would result in a subtractive effect where the sample rotation angle 385 is smaller than the nominal stage tilt angle 390. If desired, the slope may change between a positive value and a negative value as a function of the distance that the slider 350 has moved when the base plate 360 is tilted.

If desired, the upper surface 366 of the base plate 360 may be curved (not shown) in a direction perpendicular to a direction that the slider 350 can move. Then correction may potentially be made for other types of misalignment of the sample 330 when clamped in the vice 340, including roll, pitch, and yaw.

The upper surface 356 of the slider 350 and the lower surface 343 of the vice 340 should accommodate each other without binding. Binding occurs when two surfaces come into contact with each other in such a manner that they subsequently are unable to disengage and slide past each other.

Figure 4A:
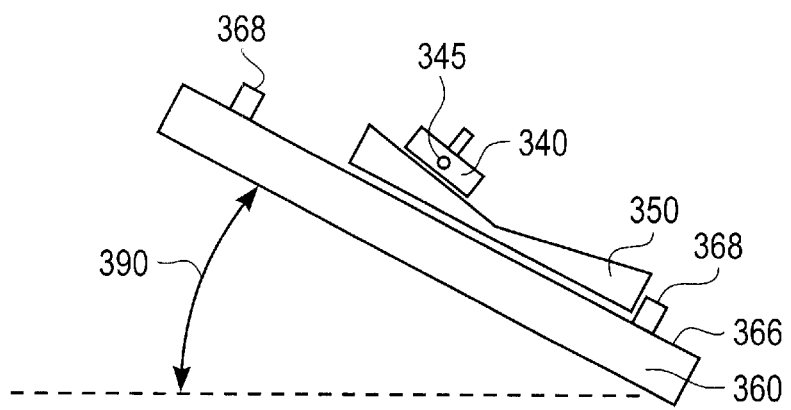
FIGS. 4(a)–(c) are illustrations of different methods to prevent binding.

The vice 340 may bind with the slider 350 when the base plate 360 is tilted. Binding may be prevented by using physical stops 368 towards both ends of the upper surface 366 of the base plate 360 to limit the travel of the moving slider 350 when the base plate 360 is tilted, as shown in FIG. 4(a). The locations of the physical stops 368 may be empirically adjusted.

Figure 4B:
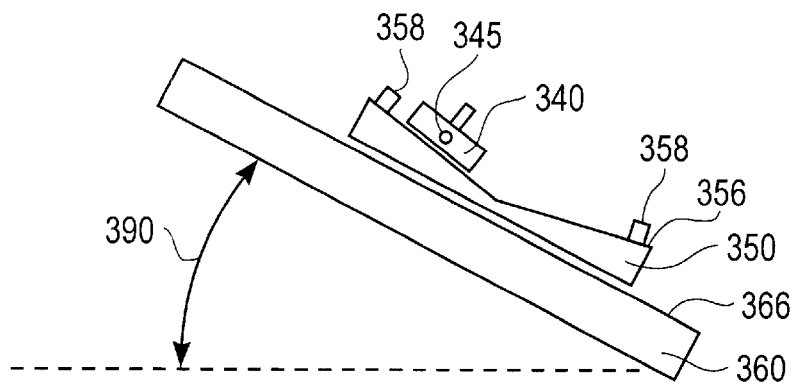

Alternatively, binding may be prevented by using physical stops 358 towards both ends of the upper surface 356 of the slider 350 to limit the travel of the vice 340 rotating around the axis 345 when the vice 340 is pushed by the slider 350, as shown in FIG. 4(b). The locations of the physical stops 358 may be empirically adjusted.

Figure 4C:
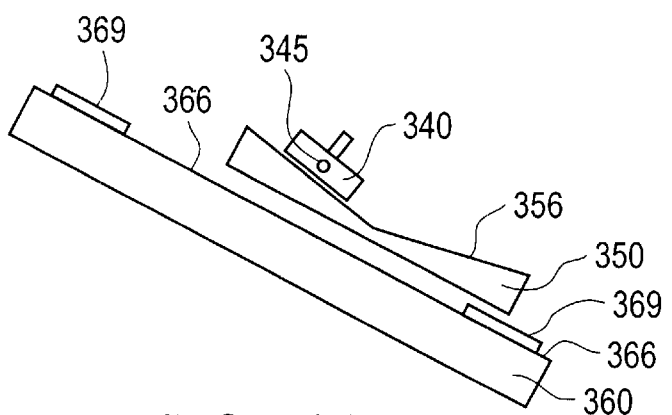

It may be desirable to prevent binding by using pads 369 with sufficiently high friction towards both ends of the upper surface 366 of the base plate 360 to limit the travel of the moving slider 350 when the base plate 360 is tilted, as shown in FIG. 4(c). Other parts of the upper surface 366 of the base plate 360 which are not covered by the pads 369 have much lower friction to facilitate easy movement of the slider 350 when the base plate 360 is tilted the locations of the pads 369 may have to be empirically adjusted.

Another method (not shown) of preventing binding involves the use of an appropriately designed torsion spring within the axis 345 around which the vice 340 rotates. As the vice 340 rotates, the torsion spring is twisted until sufficient torque is developed to counteract the rotation and finally stop the rotation.

If physical stops are not desired, magnetic bumpers (not shown) may be used to prevent binding. Either permanent magnets or electromagnets may be used to create an adequate magnetic field that increases and ultimately limits the travel of the moving slider 350 when the base plate 360 is tilted.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an apparatus for automatically tilting a sample to a desired angle for processing, measurement, or inspection.

We claim:

1. A device comprising:
   a first part, said first part adapted to move from a first position to a second position;
   a second part, said second part coupled to said first part; and
   a third part, said third part adapted to move between said first part and said second part to cause said second part to pivot at a constant distance from said first part.

2. The device of claim 1 wherein said third part moves under gravitational force in response to movement of said first part from said first position to said second position.

3. The device of claim 1 wherein said third part moves under centrifugal force in response to movement of said first part from said first position to said second position.

4. The device of claim 1 wherein said third part is a shim of variable thickness.

5. The device of claim 1 wherein said third part is a cam.

6. The device of claim 1 wherein said device forms part of a micro-electro-mechanical system (MEMS), such as a micromirror.

7. An apparatus comprising:
   a first member adapted to tilt away from a horizontal position;
   a second member suspended from an axis connected to said first member at a fixed distance; said second member being free to rotate around said axis when pushed; and
   a third member resting on said first member, said third member having a first surface and a second surface, said first surface and said second surface being opposing surfaces which are not parallel, said third member adapted to slide on said first surface on said first member, said third member adapted to push said second member with said second surface to cause said second member to rotate around said axis.

8. The apparatus of claim 7 wherein said third member slides under force of gravity when said first member tilts away from said horizontal position.

9. A fixture to position a sample comprising:
   a base plate adapted to tilt to a first angle;
   a pin attached to said base plate;
   a vice adapted to clamp said sample, said vice further adapted to rotate around said pin; and
   a slider located on said base plate and below said vice, said slider adapted to move under force of gravity when said base plate is tilted to said first angle, said slider further adapted to push said vice to rotate to a second angle, said second angle differing from said first angle by a fixed amount.

10. The fixture of claim 9 wherein said base plate is tilted by using an electrically-controlled motor or actuator.

11. The fixture of claim 9 wherein said base plate is tilted by using a pneumatically-controlled motor or actuator.

12. The fixture of claim 9 wherein said first angle has a constant value.

13. The fixture of claim 9 wherein said first angle is 52 degrees.

14. The fixture of claim 9 wherein said sample comprises a portion of a Silicon wafer, said Silicon wafer being used for fabricating integrated circuits.

15. The fixture of claim 9 wherein said sample further comprises a copper grid to which said portion of said Silicon wafer is attached.

16. The fixture of claim 9 wherein said slider comprises a double-wedge shape.

17. The fixture of claim 9 wherein said slider comprises a single-wedge shape.

18. The fixture of claim 9 wherein said fixed amount is 10 degrees.

19. The fixture of claim 9 wherein said base plate comprises nickel-plated aluminum.

20. The fixture of claim 9 wherein said vice comprises stainless steel.

21. The fixture of claim 9 wherein said slider comprises stainless steel.

* * * * *